United States Patent [19]
Fletcher et al.

[11] 3,978,350
[45] Aug. 31, 1976

[54] DUAL MODE SOLID STATE POWER SWITCH

[76] Inventors: James C. Fletcher, Administrator of the National Aeronautics and Space Administration, with respect to an invention of Louis C. Maus, Huntsville; Donald E. Williams, New Hope, both of Ala.

[22] Filed: Mar. 11, 1975

[21] Appl. No.: 557,444

[52] U.S. Cl. ............................. 307/255; 307/300; 307/313; 307/315
[51] Int. Cl.² .................................... H03K 17/60
[58] Field of Search ........... 307/254, 255, 300, 313, 307/315

[56] References Cited
UNITED STATES PATENTS

| | | | |
|---|---|---|---|
| 3,436,563 | 4/1969 | Regitz | 307/315 X |
| 3,676,713 | 7/1972 | Wiedmann | 307/300 |
| 3,845,405 | 10/1974 | Leidich | 307/300 X |

*Primary Examiner*—John Zazworsky
*Attorney, Agent, or Firm*—L. D. Wofford, Jr.; George J. Porter; John R. Manning

[57] ABSTRACT

A solid state amplifier has an output transistor stage and an input transistor stage interconnected as a Darlington circuit. An interstage transistor interconnecting the collectors of the two stages of the Darlington circuit is connected with the first stage transistor in a compound configuration. When the load current furnished by the amplifier is less than a predetermined value, the output stage operates as a simple saturated switch with its base drive current flowing through the emitter-base junction of the first stage which produces no collector current because the base-emitter junction of the interstage transistor is reverse-biased. When the load current exceeds said predetermined value, the interstage transistor begins to conduct allowing the input and output stages to operate as a Darlington amplifier and diverting a significant portion of the base drive current of the output transistor back into the load.

5 Claims, 3 Drawing Figures

DUAL MODE SOLID STATE POWER SWITCH

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

This invention relates to a dual mode solid state power switch which operates as a simple saturated switch when the load current is less than a predetermined value, and as a Darlington circuit when an overload or transient condition exists, such power switch being referred to hereinafter as a power switch of the type described.

A power switch of the type described is disclosed in U.S. Pat. No. 3,678,291 issued July 18, 1972 to R.J. Coe. In this power switch, a two-stage transistor amplifier is interconnected in a Darlington configuration with a diode connecting the collectors of the two stages. When the load current is less than a predetermined value, the output transistor operates as a saturated switch with base drive current for this transistor flowing through the emitter-base junction of the first stage. In this condition, the diode is reverse-biased preventing the flow of collector current in the first stage. As the load current exceeds said predetermined value, the voltage at the anode of the diode increases while the voltage at the cathode is lowered due to the increased load current flowing in the output stage. Ultimately, the diode is forwardly biased shifting the mode of operation of the power switch from a saturated switch mode to a Darlington circuit mode. In the latter mode, the output stage is capable of handling the overload current without burning out.

While the Coe power switch efficiently handles rated load current while operating in its saturated switch mode, its efficiency is reduced when operating in its Darlington circuit mode under overload conditions due to the flow of collector current in the first stage. While such current is returned to the load, it passes through the diode whose forward resistance introduces significant losses that reduce the efficiency of the switch.

It is to improve the efficiency of a power switch of the type described when operating in the Darlington circuit mode that constitutes an object of the present invention.

SUMMARY OF THE INVENTION

Briefly, this and other objects of the invention are achieved by providing an active element for the interstage connection rather than a passive diode. Where the first stage of the power switch and the active element are transistors connected in a compound configuration, the base current drive of the interstage transistor is relatively small due to its high input impedance. This factor reduces power losses and thus increases overall efficiency. Additionally, the greater part of the base current drive of the output transistor is diverted back to the load through the collector of the interstage transistor. This factor guarantees a lower saturation voltage (i.e., the collector-to-emitter voltage across the output transistor). Thus, the switch according to the present invention has both a lower switch drop and power loss than known power switches of the type described. Finally, the large gain associated with the power switch of the present invention improves the control of the turn-on and turn-off rates. The power switch of the present invention thus has characteristics similar to an operational amplifier in that it has high input impedance, high gain and phase inversion.

BRIEF DESCRIPTION OF THE DRAWINGS

Embodiments of the invention are illustrated in the accompanyng drawings wherein.

DESCRIPTION OF THE PREFERRED EMBODIMENTS

Figure 1:
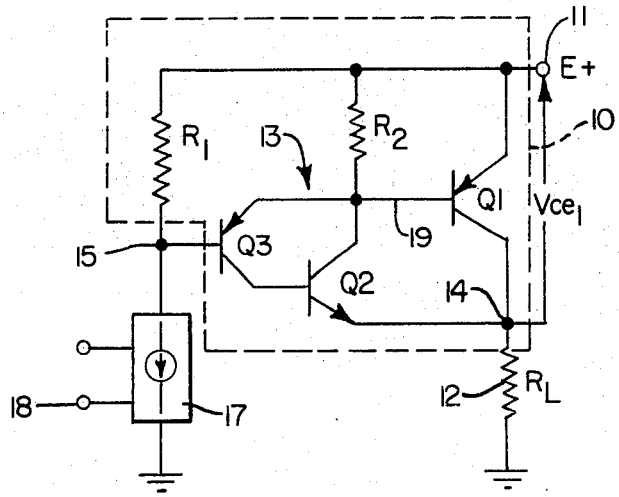
FIG. 1 is a circuit diagram showing one embodiment of the present invention.

Referring now to FIG. 1, reference numeral 10 designates the first embodiment of a power switch according to the present invention for connecting a substantially constant power source 11 to an electrical load 12. Embodiment 10 comprises a solid state amplifier having an output stage Q1 and an input stage Q3 interconnected in a Darlington circuit 13 having an output terminal 14 for connection to load 12 and an input terminal 15. Each transistor of the input and output stages is of the pnp type arranged with the base of transistor Q1 connected to the emitter of transistor Q3. The bases of each of these transistors is connected to the electrical source 11 through suitable bias resistors R1 and R2 as shown in the drawing.

Interconnected between the two stages of the Darlington circuit 13 is transistor Q2 which is interconnected with the input transistor Q3 in a compound configuration of the npn-pnp type. Thus, the collector of transistor Q2 is connected to common connection in lead 19 between the base of output transistor Q1 and the emitter of transistor Q3, while the base of interstage transistor Q2 is connected to the collector of input transistor Q3. The emitter of the interstage transistor Q2 is connected to the output terminal 14.

A selectively operable constant current source 17 is connected to the input terminal 15 of embodiment 10. Source 17 is shown schematically in FIG. 1 and may actually be a transistor which is driven into its active region by a suitable control voltage applied across the control terminals 18 in a manner well known in the art.

In operation, the application to terminals 18 of a control voltage which turns on the constant current source 17 provides base current to the input transistor Q3. Since the emitter-base junctions of each of the transistors Q1 and Q3 are forwardly biased by reason of the bias resistors R1 and R2, base drive current will flow through base lead 19 and the emitter-base junction of transistor Q3. Transistor Q1 will saturate and when the electrical load 12 has a value not exceeding a predetermined value, rated load current will flow through load 12. During this mode of operation wherein the power switch is operating as a simple saturated switch, the base-to-emitter junction of transistor Q2 will be reverse-biased preventing the flow of current through the collector of transistor Q3. That transistor Q2 is reverse-biased can be seen from a consideration of typical values associated with transistors suitable for the configuration shown in FIG. 1. For example, during the saturated mode of operation of a silicon transistor, a typical value of the collector-to-emitter voltage drop is about 200 mv which places the emitter of transistor Q2 (node 14) at a voltage of about 200 mv below the voltage of source 11. For a silicon transistor, the base-to-emitter voltage during saturated operation will be about 700 mv which places the emitter of transistor Q3 about 700 mv below the voltage of source 11. In the absence of transistor action on the part of transistor Q3, the voltage difference between the emitter and collector of this transistor will be less than 100 mv. Consequently, the base voltage of transistor Q2 (which is the same as the collector voltage of transistor Q3) will be approximately 800 mv below the voltage of source 11. Thus, there is an approximately 600 mv reverse-bias on the base-to-emitter junction of transistor Q2, and the latter is cut-off.

Figure 2:
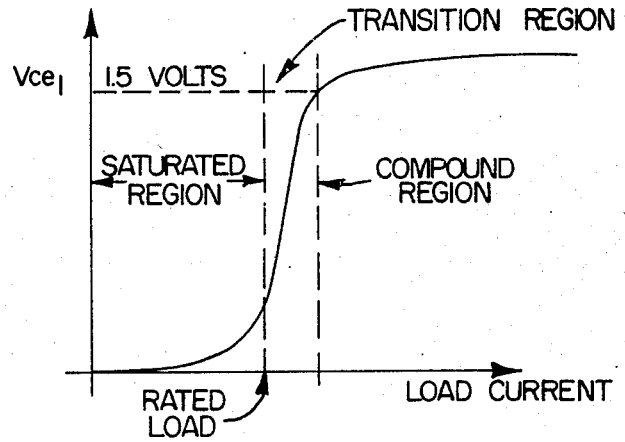
FIG. 2 shows the variation in the saturation voltage of the output transistor as a function of load current for the two modes of operation of the embodiment shown in FIG. 1.

During operation of power switch 10 in the saturated mode described above, the collector-to-emitter voltage of the output transistor Q1 remains at a relatively low value as long as the load current does not exceed a predetermined value as indicated in FIG. 2. When the ohmic value of load 12 decreases and the load current exceeds said predetermined value, which is termed, for convenience, the "rated load current," there is a rapid increase in the collector-to-emitter voltage of this transistor (node 14) as a result of the increased load current. This is shown in the "transition" region in FIG. 2. While this is occurring, the base drive current of transistor Q3 is maintained at a constant level by reason of the constant current sources 17. Consequently, the voltage drop between the emitter of transistor Q1 and the collector of transistor Q3 will remain substantially constant as the collector-to-emitter voltage of Q1 increases. Ultimately, a level of load current is reached at which the base-to-emitter junction of transistor Q2 will be forwardly biased into conduction. If transistor Q2 is a silicon transistor, it will be fully conducting when its base-to-emitter voltage is of the order of magnitude of 700 mv. Since the collector of transistor Q3 is maintained at about 800 mv below the voltage of source 11, full conduction of transistor Q2 will occur when the emitter-to-collector voltage of transistor Q1 is approximately 1.5 volts.

When transistor Q2 is fully conducting, the power switch 10 operates as a Darlington circuit and the base current flowing through transistor Q1 will increase thereby inhibiting a further rapid increase in the emitter-to-collector voltage of transistor Q1 as shown in the "compound" region of FIG. 2. Further rise in the emitter-to-collector voltage is inhibited because a portion of the base drive current of transistor Q1 is diverted through transistor Q2 to the load as transistor Q3 begins to conduct thereby furnishing base drive current to transistor Q2. Thus, the collector current flowing in transistors Q2 and Q3 finds its way to the load 12 thereby increasing the efficiency of the power switch. Unlike power switches of the type described heretofore known, the major increase in the base current drive of the output transistor Q1 passes through the collector-to-emitter junction of transistor Q2 and into the load without substantial dissipation thereby increasing the efficiency of the power switch according to the present invention.

Figure 3:
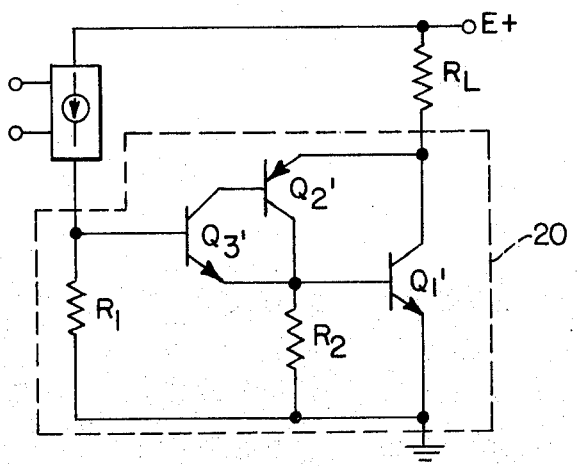
FIG. 3 is a second embodiment of the invention suitable for ground switching of loads and equipment.

A second embodiment of the invention is illustrated in FIG. 3 wherein power switch 20 is placed in the "ground" side of the load instead of in the "high" or power side of the load as illustrated in FIG. 1. In switch 20, the output and input transistors Q1', Q3' are of the npn type, while the coupling transistor Q2' is of the pnp type, just opposite of the types found in switch 10. In addition, the polarity of the control signal is reversed. The operation of switch 20 is, however, the same as the operation of switch 10.

In summary, the power switch according to the present invention has the following advantages over conventional power switches of the type described: greater efficiency, higher input impedance and higher overall switch gain. These advantages result in further attributes such as reduced thermal stresses within the components, smaller physical package size, reduced loading of base drive circuits, and easier feedback control due to higher gain.

I claim:
1. A dual mode solid state power switch comprising:
   a. a solid state amplifier having an output stage and an input stage interconnected into a Darlington circuit with an output terminal for conducting load current to an electrical load, and an input terminal;
   b. a selectively operable constant current source connected to the input terminal for causing the output stage to operate as a saturated switch when the load current is less than a predetermined value; and
   c. active interstage means between the two stages of the solid state amplifier for diverting a portion of the current drive of the output stage from the input stage to the load when the load current exceeds said predetermined value.

2. A dual mode solid state power switch according to claim 1 wherein both the input stage of the solid state amplifier and the active interstage means are transistors interconnected in a compound configuration.

3. A dual mode solid state power switch according to claim 2 wherein the compound transistor is of the npn-pnp type.

4. A dual mode solid state power switch according to claim 3 wherein the output stage of the solid state amplifier is a transistor having an emitter for connection to a positive voltage source, and a collector that constitutes the output terminal of the amplifier.

5. A dual mode solid state power switch according to claim 3 wherein the output stage of the solid state amplifier is a transistor having an emitter for connecting to an electrical ground, and a collector that constitutes the output terminal of the amplifier.

* * * * *